(12) United States Patent
Goden et al.

(10) Patent No.: US 7,453,201 B2
(45) Date of Patent: Nov. 18, 2008

(54) DISPLAY APPARATUS AND METHOD FOR MANUFACTURING SAME

(75) Inventors: Tatsuhito Goden, Kawasaki (JP); Somei Kawasaki, Saitama (JP); Masami Iseki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/565,159

(22) Filed: Nov. 30, 2006

(65) Prior Publication Data

US 2007/0126681 A1 Jun. 7, 2007

(30) Foreign Application Priority Data

Dec. 5, 2005 (JP) ............... 2005-350779
Oct. 25, 2006 (JP) ............... 2006-290087

(51) Int. Cl.
*H01L 51/50* (2006.01)
*H01L 51/56* (2006.01)

(52) U.S. Cl. ............ 313/504; 313/503; 313/505; 313/506; 315/169.3; 445/24; 445/25; 427/66

(58) Field of Classification Search ........... 345/92; 313/500–512; 445/24, 25; 427/66; 315/169.3
See application file for complete search history.

(56) References Cited

U.S. PATENT DOCUMENTS

2003/0044639 A1* 3/2003 Fukuda ............... 428/690
2005/0168490 A1* 8/2005 Takahara ............. 345/690
2006/0114176 A1* 6/2006 Furuie et al. .......... 345/45

FOREIGN PATENT DOCUMENTS

JP 48-102412 12/1973
JP 08-054836 4/1977

OTHER PUBLICATIONS

Arkwright, et al. Optics Express, vol. 13, No. 7, Apr. 4, 2005, pp. 2731-2741.*
http://web.archive.org/web/20060526072950/http://en.wikipedia.org/wiki/Semiconductor_fabrication, May 19, 2006.*

* cited by examiner

*Primary Examiner*—Mariceli Santiago
(74) *Attorney, Agent, or Firm*—Fitzpatrick, Cella, Harper & Scinto

(57) ABSTRACT

In a display apparatus, second organic EL elements are closer to the edge of a display portion than first organic EL elements. The voltage drop in the first organic EL element is larger than that in the second organic EL element. The thickness of the organic compound layer in the first organic EL element is different from the thickness of the organic compound layer in the second organic EL element. The light-extraction efficiency in the first organic EL element is higher than the light-extraction efficiency in the second organic EL element.

5 Claims, 6 Drawing Sheets

DISPLAY APPARATUS AND METHOD FOR MANUFACTURING SAME

BACKGROUND OF THE INVENTION

1. Field of the Invention

The present invention relates to a display apparatus having organic electroluminescence elements (hereinafter referred to as organic EL elements) that emit light when a current is injected.

2. Description of the Related Art

Recently, a display apparatus employing organic EL elements has been intensely researched. An organic EL display has advantages, such as a high luminance, a wide viewing angle, and a low power consumption, and has gotten much attention as an alternative to a liquid crystal display.

An organic EL display apparatus includes a plurality of organic EL elements, which need to be individually driven. In general, when an organic EL element emits light, a current is supplied from a power source disposed outside a display area where organic EL elements are disposed, and then the current flows to the ground potential. That is to say, a current flows between both electrodes of an organic EL element disposed between the supply potential and the ground potential, and thereby a light emission is obtained. There are two technologies to drive organic EL elements: so-called passive matrix technology and so-called active matrix technology. In the passive matrix technology, the intersections of crisscrossing stripe-like electrodes are sequentially driven. In the active matrix technology, each organic EL element is provided with a thin film transistor (TFT), which controls driving the element.

Japanese Patent Laid-Open No. 8-54836 discloses an active matrix light-emitting element. The light-emitting element includes an electron injection electrode connected to the drain electrode of a TFT via a contact hole, and a hole injection electrode opposed thereto. The hole injection electrode is a layer of indium tin oxide (ITO), which is a transparent conductive material. Light is extracted from the side of this electrode. An organic thin film layer disposed between the opposing electrodes is supplied with a current controlled by the TFT, thereby emitting light.

The interconnect part connecting a circuit determining the supply potential and an organic EL element and the interconnect part connecting a circuit determining the ground potential and an organic EL element have electrical resistance. Therefore, voltage drop occurs in the interconnect parts and affects the current supplied to the organic EL element. The voltage drop in the interconnect parts is noticeable particularly in a high-definition display apparatus having thin interconnects or a large-sized screen display apparatus having long interconnects.

In addition, the effect of the resistance of the interconnect parts is noticeable particularly in the case where, in an active matrix display apparatus, the light-extraction side electrode is a transparent conductive film such as ITO and a common electrode shared by pixels. When an electrode is shared by pixels, the electrode functions as an interconnect connecting to a circuit disposed outside the display area. That is to say, when a pixel is turned on, a current flows through the part of the electrode corresponding to the other pixels. When the electrode is formed of a material having a resistance larger than that of a metal film, for example, when the electrode is formed of a transparent conductive film, voltage drop is noticeable in the electrode part and affects the current supplied to the pixel part.

Similarly, voltage drop can occur also in a passive matrix display apparatus. In the case of a passive matrix display apparatus, electrodes are stripe-like in shape. When a pixel is turned on, the part of an electrode corresponding to the other pixels functions as an interconnect. Therefore, when the electrode is formed of a material having a large resistance, for example, a transparent conductive material, voltage drop is noticeable in the electrode part and affects the current supplied to the pixel part.

As described above, the current supplied to an organic EL element is affected by the electrical resistance of the interconnect parts. This effect depends on the position of a pixel in the display area. In general, the closer a pixel to the circuit disposed outside the display area, the smaller the voltage drop which occurs in the interconnect, and, therefore, the larger the current which is supplied to the pixel. The more distant the pixel from the circuit, the larger the voltage drop which occurs in the interconnect, and, therefore, the smaller the current which is supplied to the pixel. Therefore, the central part of the display area is darker and the peripheral part of the display area is brighter. The uneven display which occurs thus deteriorates the display quality.

SUMMARY OF THE INVENTION

The present invention provides a more uniform display apparatus; that is to say, a display apparatus that has a more even luminance throughout the display area.

In an aspect of the present invention, a display apparatus includes a display portion and a circuit that supplies a voltage for driving the display portion. The display portion includes a plurality of organic electroluminescence (EL) elements, each organic EL element including an upper electrode, a lower electrode, and an organic compound layer disposed between the upper electrode and the lower electrode. The circuit supplies a voltage for driving a first organic EL element and a second organic EL element that is closer to the edge of the display portion than the first organic EL element. The voltage drop in the first organic EL element is larger than that in the second organic EL element. The thickness of the organic compound layer in the first organic EL element is different from the thickness of the organic compound layer in the second organic EL element. The light-extraction efficiency in the first organic EL element is higher than the light-extraction efficiency in the second organic EL element. Accordingly, the product of a.b, wherein a is current driving the second organic EL element and b is the light-extraction efficiency thereof is substantially equal to the product of c.d, wherein c is current driving the first organic EL element and d is the light-extraction efficiency thereof to provide a more uniform luminance in the display portion.

In another aspect of the present invention, a method for manufacturing a display apparatus includes a display portion and a circuit that supplies a voltage for driving the display portion. The display portion includes a plurality of organic electroluminescence (EL) elements, each organic EL element including an upper electrode, a lower electrode, and an organic compound layer disposed between the upper electrode and the lower electrode. The circuit supplies a voltage for driving a first organic EL element and a second organic EL element that is closer to the edge of the display portion than the first organic EL element, wherein a difference in driving voltage occurs between the first and second organic EL elements. The method comprises controlling film thickness of the organic compound layer in the first organic EL element to be different from film thickness of the organic compound layer in the second organic EL element, so as to compensate for the difference in the drive voltage between the first organic EL element and the second organic EL element.

In another aspect of the present invention, a method for manufacturing a display apparatus includes the step of forming a plurality of organic EL elements in each of a plurality of display apparatus areas on a substrate, and the step of separating the substrate after the step of forming a plurality of organic EL elements, so as to obtain a plurality of display apparatuses. The step of forming a plurality of organic EL elements includes the substep of forming an organic compound layer by deposition using a mask having a plurality of sets of different opening patterns such that the openings in the central part are larger than the openings in the peripheral part.

Further features of the present invention will become apparent from the following description of exemplary embodiments (with reference to the attached drawings).

DESCRIPTION OF THE EMBODIMENTS

Figure 1:
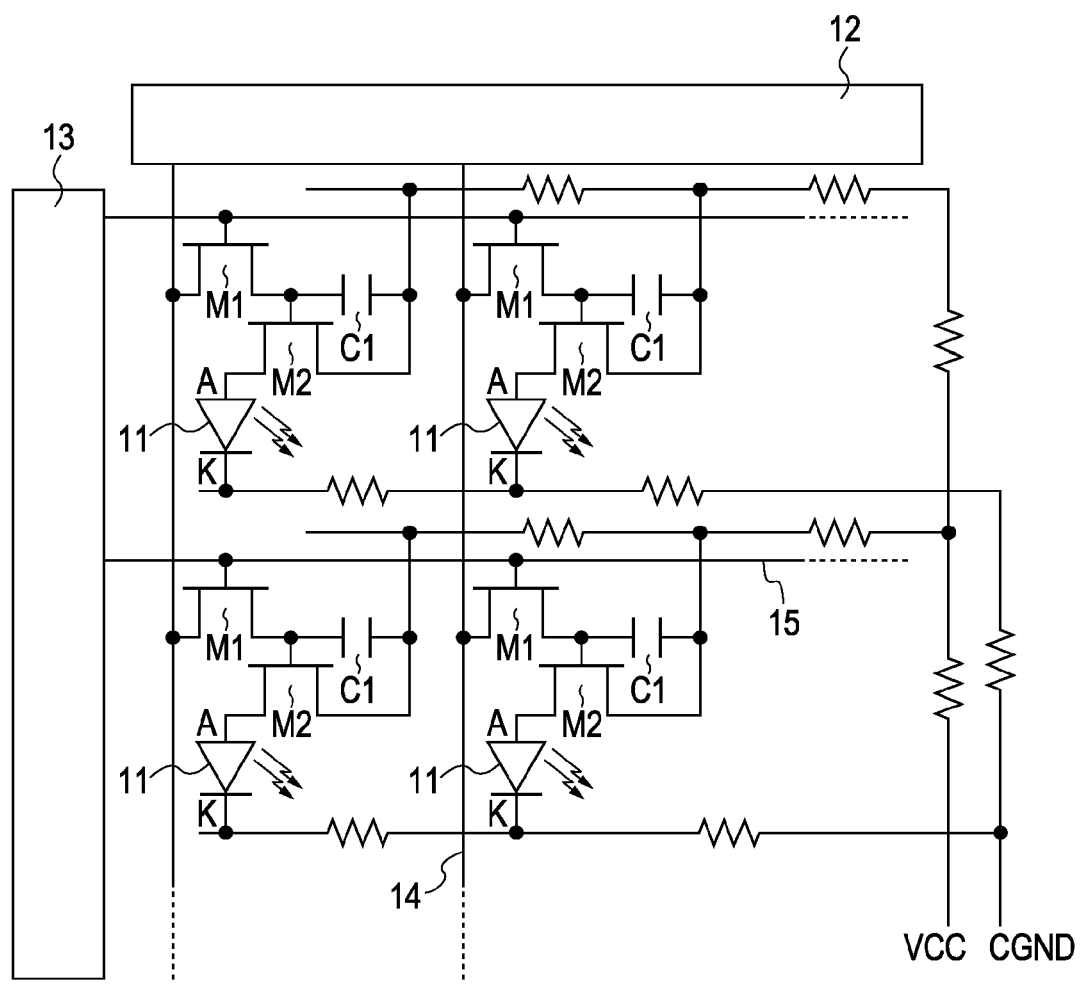
FIG. 1 is a schematic view showing the circuit wiring of a display apparatus according to an embodiment of the invention.

The embodiments of the present invention will now be described. However, the present invention is not limited to these embodiments.

The display apparatus according to the present invention includes a display portion in which a plurality of organic EL elements are disposed, each element including an upper electrode, a lower electrode, and an organic compound layer disposed between the electrodes. The apparatus further includes a circuit that supplies a voltage for driving a first organic EL element and a second organic EL element that is closer to the edge of the display portion than the first organic EL element. Specifically, the circuit includes a first circuit and a second circuit. The first circuit is connected to the upper electrode via an interconnect and determines a first potential. The second circuit is connected to the lower electrode via an interconnect and determines a second potential.

Accordingly, the display apparatus according to the present invention is a display apparatus in which a screen provides a display by luminescence of a plurality of organic EL elements. The display apparatus may be a monochrome display apparatus all of whose pixels emit light in the same color, or a full-color display apparatus that emits light in units of three pixels corresponding to three colors of red (R), green (G), and blue (B). One of the first potential and the second potential is the supply potential, and the other is the ground potential. The ground potential need not necessarily be at zero potential, but includes a point that has a constant potential and serves as a reference potential. The luminescence of an organic EL element is caused by a current that is supplied from the supply potential and flows into the organic EL element via an interconnect. After passing through the organic EL element, the current flows to the ground potential via an interconnect.

The plurality of organic EL elements include first organic EL elements and second organic EL elements. The second organic EL elements are closer to the edge of the display portion than the first organic EL elements. The resistance between the upper electrode and the first circuit or the resistance between the lower electrode and the second circuit in the first organic EL elements is larger than the corresponding resistance in the second organic EL elements. That is to say, the drive voltage drop caused by the resistance between an electrode and a circuit that supplies the driving voltage in the first organic EL elements is larger than the corresponding drive voltage drop in the second organic EL elements. The display portion includes a portion in which a plurality of organic EL elements are disposed and that displays an image, characters, and the like. The edge of the display portion means the periphery of the display portion.

The drive voltage drop may be caused by the resistance between the upper electrode and the first circuit or the resistance between the lower electrode and the second circuit or both. The drive voltage drop means a drop in the voltage for luminescence of an organic EL element that occurs because a current flows through an interconnect part and power is consumed by the resistance of the interconnect part. In order to uniformize the above-noted voltage drops and provide a more uniform display, various measures can be undertaken.

The thickness of the organic compound layer in the first organic EL element is made different from the thickness of the organic compound layer in the second organic EL element. The light-extraction efficiency in the first organic EL element is thus made higher than the light-extraction efficiency in the second organic EL element. The difference in the film thickness of the organic compound layer between the first organic EL elements and the second organic EL elements does not mean, for example, in the case of a display apparatus in which are disposed a plurality of kinds of pixels corresponding to three colors R, G, and B, that the difference in the film thickness is between the red elements and the blue elements. The display apparatus according to the present invention provides a display such that there is no difference in luminescence intensity between the central part and the peripheral part of the display area. In the case of a display apparatus having three kinds of pixels corresponding to three colors R, G, and B, the difference in the film thickness of the organic compound layer between the first organic EL elements and the second organic EL elements means that pixels corresponding to at least one color include elements having different film thicknesses of the organic compound layer. In addition, the light-extraction efficiency is the photon that is extracted to the exterior of an organic EL element compared to the photon that is generated in the organic compound layer of the organic EL element.

The voltage drop caused by the resistance of interconnects will be described with reference to the drawings.

FIG. 1 is a schematic view showing the circuit wiring of a display apparatus according to an embodiment of the invention. FIG. 1 shows a circuit of a so-called active matrix display apparatus. In FIG. 1, reference numeral 11 denotes an organic EL element, reference numeral 12 denotes a data line drive circuit, reference numeral 13 denotes a scanning line drive circuit, reference numeral 14 denotes a data line, and reference numeral 15 denotes a scanning line. Reference character M1 denotes a TFT that is a switching transistor which controls the luminescence of an organic EL element. Reference character M2 denotes a TFT that is a drive transistor that controls the luminescence intensity of an organic EL element. Reference character C1 denotes a storage capacitor for storing electrical energy for generating luminescence. Reference character VCC denotes the supply potential, and reference character CGND denotes the ground potential. Reference characters A and K denote an anode and a cathode, respectively, of each organic EL element.

Figure 6:
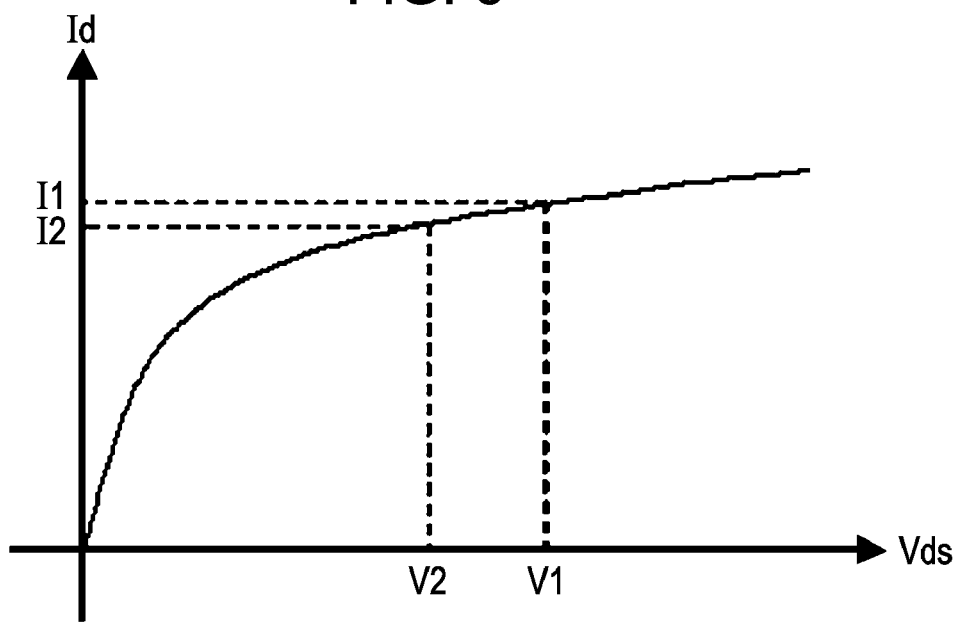
FIG. 6 is a diagram showing the relationship between the drain current Id and the source-drain potential difference Vds (Vds-Id characteristics) of the drive transistor M2.

In the display apparatus according to this embodiment, a unit of pixel circuit includes an organic EL element 11, a switching transistor M1, a drive transistor M2, and a storage capacitor C1, and a large number of such units are arranged in a matrix. The anode A of the organic EL element is connected to a circuit determining the supply potential VCC via the drive transistor, and the cathode K is connected to a circuit determining the ground potential CGND. The luminescence of the organic EL element is caused by the flow of current between the circuit determining the supply potential VCC and the circuit determining the ground potential CGND according to the gate potential of the drive transistor. In general, the luminescence intensity of the organic EL element is determined by the gate potential of the drive transistor. However, it is also affected by the source-drain potential difference of the drive transistor. This is known as the Early effect. The Early effect will be described with reference to FIG. 6. FIG. 6 is a diagram showing the relationship between the drain current Id and the source-drain potential difference Vds (Vds-Id characteristics) of the drive transistor M2. The gate voltage is constant. With increase of Vds, the gradient of the curve showing the Vds-Id characteristics decreases. However, due to the Early effect, the gradient does not become zero. Therefore, if organic EL elements differ in source-drain potential difference Vds, even if the elements are equal in the gate potential of the drive transistor M2, the elements differ in drain current Id, i.e., the current flowing to the element and, therefore, differ in luminescence intensity.

Although the supply potential VCC and the ground potential CGND are schematically shown in FIG. 1, in fact, a part that determines the supply potential or the ground potential is a circuit disposed outside the display area. Therefore, due to the voltage drop by the resistance of the interconnect part from the circuit to the organic EL element, the potentials of the anode A and the cathode K of the organic EL element differ from the potentials of the supply potential VCC and the ground potential CGND.

In this embodiment, a pixel circuit has the configuration shown in FIG. 1. However, the pixel circuit of the present invention is not limited to the circuit shown in FIG. 1. For example, the pixel circuit of the present invention may have three or four TFTs. In addition, although the pixel circuit of FIG. 1 is a so-called voltage programming circuit, it may be a so-called current programming circuit.

Moreover, the drive technology of the display apparatus according to the present invention is not limited to the active matrix technology shown in FIG. 1. The drive technology may be the passive matrix technology.

The reason that different organic EL elements have different anode potentials or cathode potentials will be described with reference to FIG. 2 showing the actual apparatus configuration.

Figure 2A:
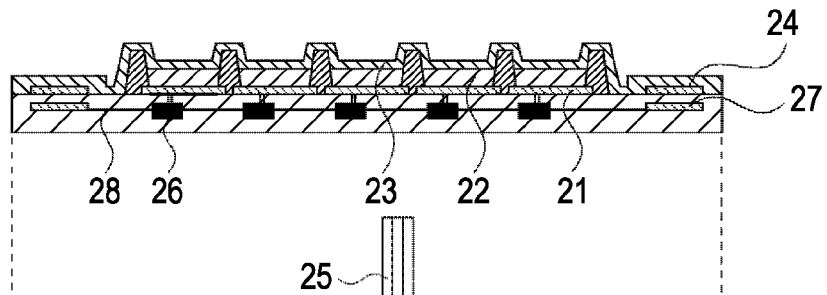
FIGS. 2A to 2C are schematic views showing a display apparatus according to the embodiment of the invention.
Figure 2B:
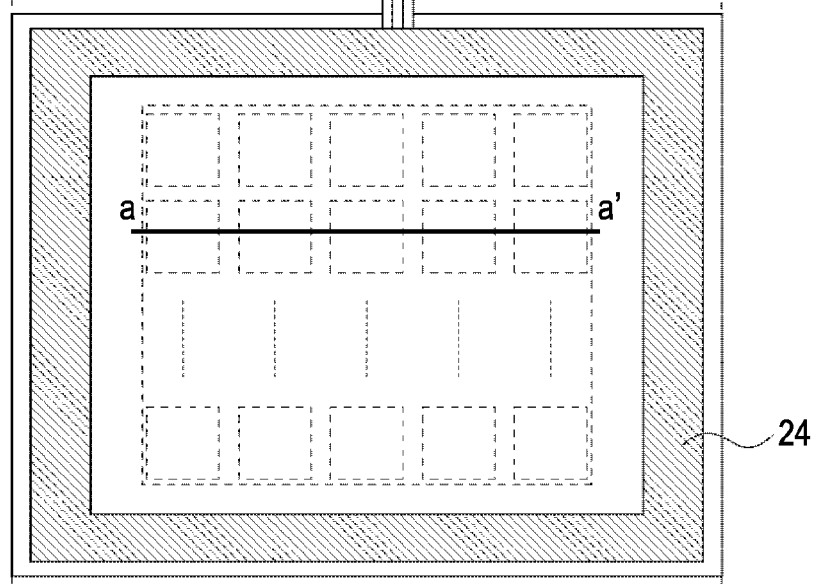
Figure 2C:
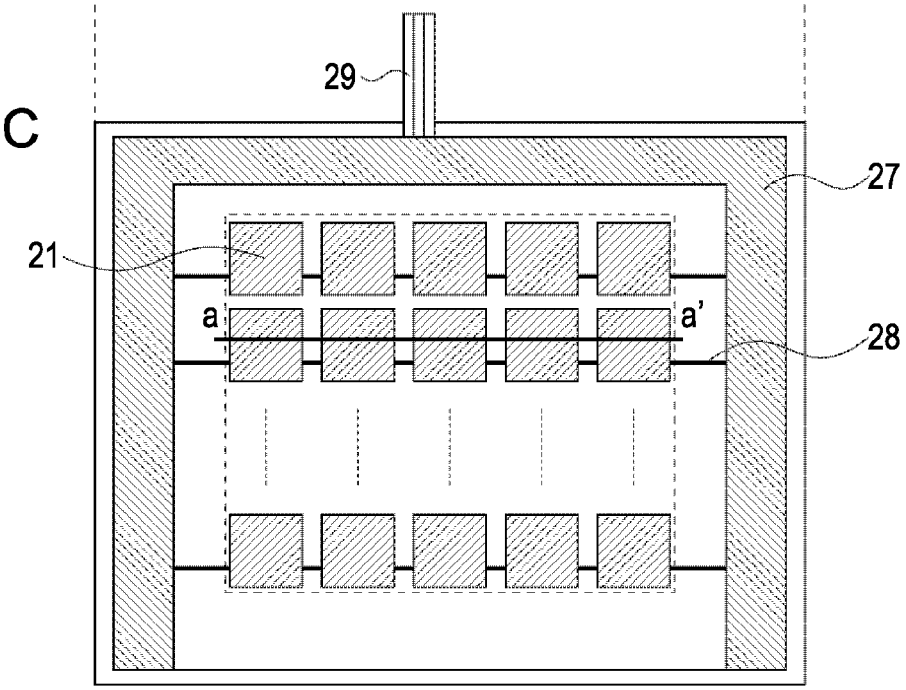

FIGS. 2A to 2C are schematic views showing a display apparatus according to this embodiment. FIG. 2A is a schematic sectional view of the display apparatus. FIG. 2B schematically shows the upper electrode part viewed from above the emitting surface. FIG. 2C schematically shows the lower electrode part viewed from above the emitting surface. Reference numeral 21 denotes a lower electrode, reference numeral 22 denotes an organic compound layer, reference numeral 23 denotes an upper electrode, reference numeral 24 denotes an auxiliary interconnect, reference numeral 25 denotes a terminal, reference numeral 26 denotes a TFT, reference numeral 27 denotes an auxiliary interconnect, reference numeral 28 denotes a common interconnect, and reference numeral 29 denotes a terminal.

A lower electrode 21 is disposed in each organic EL element. Each lower electrode 21 is connected to a circuit (not shown) determining the supply potential via the TFT 26 disposed in each organic EL element. The lower electrode 21 in FIG. 2 corresponds to the anode A in FIG. 1. The source electrodes of the TFTs 26 of the organic EL elements are connected by the common interconnect 28. The common interconnect 28 is connected to the auxiliary interconnect 27 at the ends of the display apparatus. The auxiliary interconnect 27 is connected to the circuit (not shown) determining the supply potential via the terminal 29. The common interconnect 28 is provided in each row, and both ends of the common interconnect 28 are connected to the auxiliary interconnect 27. Thus, the common interconnects 28 are disposed like a ladder. The auxiliary interconnect 27 is preferably U-shaped.

The upper electrode 23 is a common electrode shared by the organic EL elements and extends outside the display area. That is to say, the upper electrode 23 functions as an electrode of each organic EL element and as an interconnect connecting each element to the ground potential. The upper electrode 23 in FIG. 2 corresponds to the cathode K in FIG. 1. Outside the display area, the upper electrode 23 covers the auxiliary interconnect 24 and is connected to the auxiliary interconnect 24. The auxiliary interconnect 24 is connected to a circuit (not shown) determining the ground potential via the terminal 25. The auxiliary interconnect 24 is preferably hollow square-shaped.

In this embodiment, the auxiliary interconnect 24 on the upper electrode 23 side is hollow square-shaped, and the auxiliary interconnect 27 on the lower electrode 21 side is U-shaped. However, the present invention is not limited to this. For example, the auxiliary interconnect 24 on the upper electrode 23 side may be U-shaped, and the auxiliary interconnect 27 on the lower electrode 21 side may be hollow square-shaped. Alternatively, the display apparatus may have a configuration not including the auxiliary interconnect 24 or 27.

In this embodiment, the upper electrode 23 is a common electrode shared by the organic EL elements, and the lower electrode 21 is an electrode disposed in each organic EL element. However, the present invention is not limited to this configuration. For example, the upper electrode 23 may be an electrode disposed in each organic EL element, and the lower electrode 21 may be a common electrode shared by the organic EL elements.

At least, the organic compound layer 22 includes an emitting layer. In addition, the organic compound layer 22 may include a hole transport layer, an electron transport layer, a hole injection layer, an electron injection layer, and the like.

The luminescence of each organic EL element is caused by the flow of current between the circuit determining the supply potential and the circuit determining the ground potential.

However, the potential of the lower electrode 21 of each organic EL element depends on the power consumption by the resistances of the common interconnect 28 and the auxiliary interconnect 27 that connect the circuit determining the supply potential and the lower electrode 21. In the organic EL elements disposed near the center of the display area, the voltage drop is greater. In the organic EL elements disposed near the edge of the display area, the voltage drop is smaller. In addition, the potential of the upper electrode in each organic EL element depends on the power consumption by the resistances of the upper electrode 23 and the auxiliary interconnect 24 that connect the circuit determining the ground potential and the part of the upper electrode 23 corresponding to the organic EL element. In the organic EL elements disposed near the center of the display area, the voltage drop is greater. In the organic EL elements disposed near the edge of the display area, the voltage drop is less. Due to these causes, depending on their position in the display area, the organic EL elements differ in anode potential or in cathode potential, and differ in luminescence intensity.

In the present invention, both the voltage drop caused by the resistance on the upper electrode 23 side and the voltage drop caused by the resistance on the lower electrode 21 side normally may occur. However, only one of the voltage drops may occur, when one of the voltage drops is much larger than the other, since the larger voltage drop dominates the current distribution.

Figure 4A:
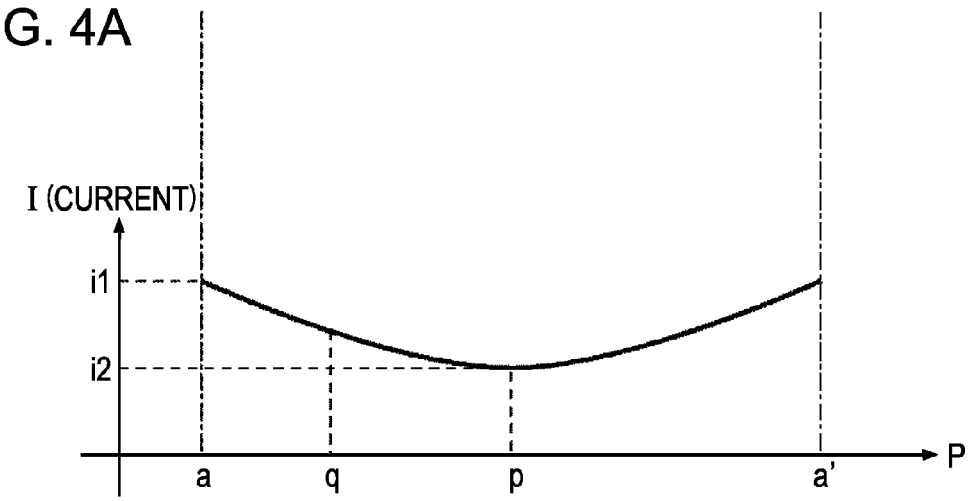
FIGS. 4A, 4B, and 4C schematically show the current, the light-extraction efficiency, and the luminance, respectively, of organic EL elements located in the cross-section taken along line a-a' of FIG. 2B or 2C, of a display apparatus according to the invention.
Figure 4B:
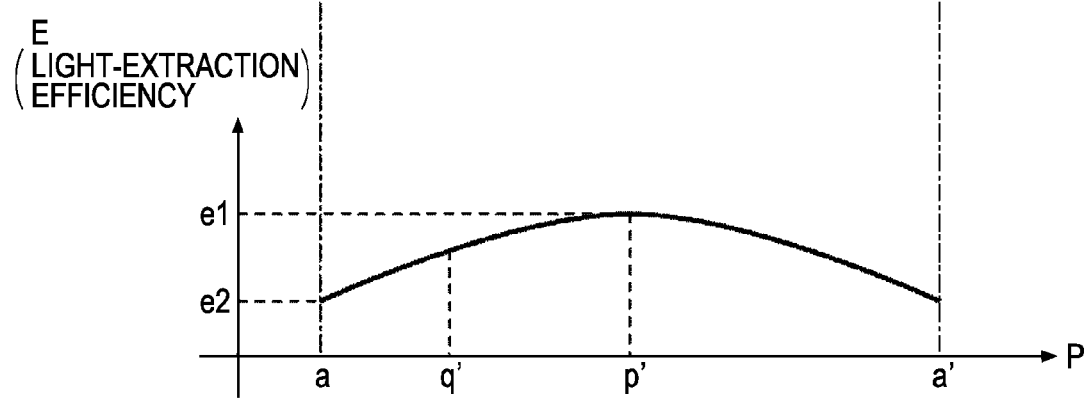
Figure 4C:
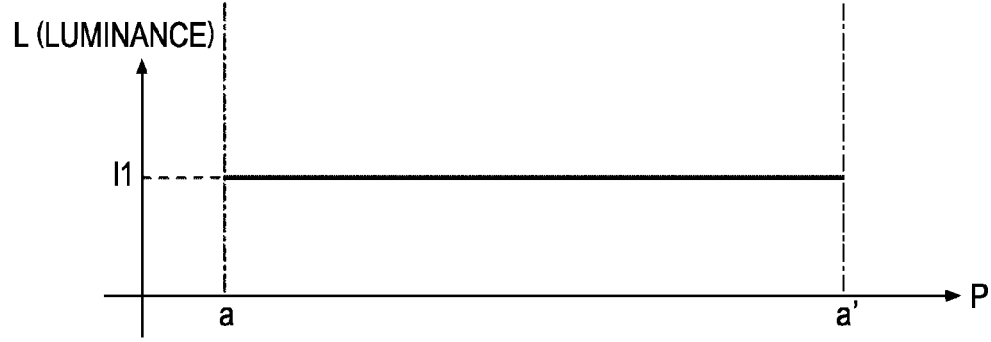

FIGS. 4A, 4B, and 4C schematically show the current, the light-extraction efficiency, and the luminance, respectively, of the organic EL elements located in the cross-section taken along line a-a' of FIG. 2B or 2C.

FIG. 4A shows the distribution of the current flowing to the organic EL elements located in the cross section taken along line a-a' of FIG. 2B or 2C when all elements in the display area emit light at the same luminance. In general, the luminance of an organic EL element is proportional to the current. Therefore, in the case of a display apparatus with non-uniform display luminance, the luminance distribution is as shown FIG. 4A. Although FIG. 4A shows a particular two-dimensional cross-section luminance of the display apparatus, the same is true in the three-dimensional case.

In order to reduce the difference in luminescence intensity caused by the difference in drive voltage depending on the position in the display area and to thereby obtain more uniform display, the inventors have applied certain optical interference principles. Specifically, the organic compound layer in first organic EL elements in which the drive voltage drop is normally larger is formed to have a film thickness such that the light-extraction efficiency is increased by optical interference. Further, the organic compound layer in second organic EL elements in which the drive voltage drop is lesser is formed to provide a film thickness such that the light-extraction efficiency in the second organic EL elements is less than that in the first organic EL elements.

Optical interference is a phenomenon wherein when two light waves are superimposed, they strengthen or weaken each other. In the present invention, it is the interference, for example, between light that travels from the emitting position to the light-extraction side and light that travels from the emitting position to the reflection side, that is reflected at the reflecting position, and that travels to the light-extraction side. In the case where the electrode on the light-extraction side is a semitransparent reflecting electrode, it is the interference caused by the reflection between the reflecting position on the semitransparent reflecting electrode and the reflecting position on the reflection side. That is to say, the present invention has at least a configuration capable of adjusting the light-extraction efficiency in the display area applying optical interference principles so as to obtain more even luminescence.

The configuration of the organic EL element according to the present invention and the optical interference therein will now be described with reference to the drawings.

Figure 3A:
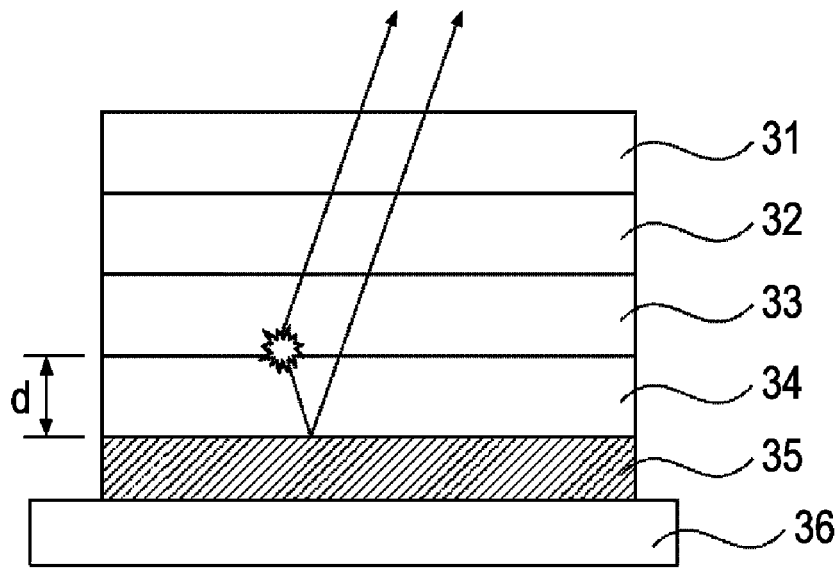
FIGS. 3A and 3B are schematic sectional views showing an example of an organic EL element constituting a display apparatus according to the present invention.
Figure 3B:
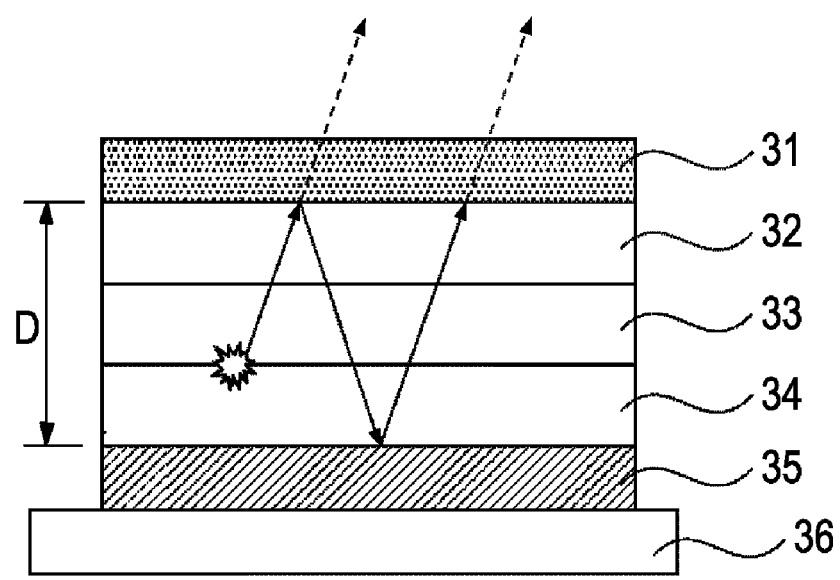

FIGS. 3A and 3B are schematic sectional views showing an example of an organic EL element constituting the display apparatus according to the present invention. Reference numeral 31 denotes a cathode, reference numeral 32 denotes an electron transport layer, reference numeral 33 denotes an emitting layer, reference numeral 34 denotes a hole transport layer, reference numeral 35 denotes an anode, and reference numeral 36 denotes a substrate.

The electron transport layer 32 and the hole transport layer 34 function to transport electrons injected from the cathode and to transport holes injected from the anode, respectively. The electrons and holes transported to the emitting layer 33 recombine in the emitting layer 33. When excited molecules return to the ground state, they emit light. In general, the luminescence often occurs near the interface between an emitting layer and a layer adjacent thereto. The luminescence often occurs particularly near the interface between the emitting layer 33 and the hole transport layer 34. When the luminescence occurs near an interface, the interface is the emitting position. When the luminescence has an intensity distribution in the emitting layer 33, the position having the highest luminescence intensity is the emitting position.

For the cathode 31 and the anode 35, the most appropriate materials are selected from the viewpoint of electron injection performance and hole injection performance, respectively, on the basis of values of the work function. In the case where light is extracted from cathode 31 side, cathode 31 is preferably formed of a highly light-transmissive conductive material, such as indium tin oxide (ITO) or indium zinc oxide (IZO). The anode 35 is preferably formed of a highly reflective material, for example, a metal such as silver, gold, platinum, aluminum, or chromium. The reason for employing a highly reflective material is to improve the light-extraction efficiency by reflecting the light emitted from the emitting layer 33 off the anode 35 so as to extract the light from the light-extraction side (the cathode 31 side).

In the case where light is extracted from the anode 35 side, anode 35 is preferably formed of a light-transmissive material, and cathode 31 is preferably formed of a reflective material. Although FIGS. 3A and 3B show the embodiment where light is extracted from the cathode 31 side, the present invention may have a configuration in which light is extracted from the anode 35 side.

In addition, although the anode 35 is the electrode closer to the substrate 36 in FIGS. 3A and 3B, the cathode 31 may be the electrode closer to the substrate 36 in the present invention. In the case where the electrode closer to the substrate 36 is the cathode 31, the organic compound layers between the electrodes are laminated in reverse order, that is to say, in order from the substrate 36, a cathode, an electron transport layer, an emitting layer, a hole transport layer, and an anode.

The layer configuration of the organic EL element is not limited to the above configuration. For example, the organic EL element may have a three-layer configuration of an anode, an emitting layer, and a cathode or a six-layer configuration of an anode, a hole transport layer, an emitting layer, an electron transport layer, an electron injection layer, and a cathode or the like.

FIGS. 3A and 3B show a so-called top emission-type configuration, that is to say, a configuration in which light is extracted from the side of the electrode farther from the substrate 36. However, the present invention may have a so-called bottom emission-type configuration, that is to say, a configuration in which light is extracted from the side of the electrode closer to the substrate 36.

The light emitted from the emitting layer 33 includes the light emitted to the cathode 31 side and the light emitted to the anode 35 side. These emissions can be strengthened by interference as shown in FIG. 3A. Such constructive interference depends on the optical distance d between the emitting position and the reflecting position. In general, when the optical distance d is an odd number multiple of $\lambda/4$, constructive interference occurs. In general, the optical distance d is expressed by the product of refractive index and film thickness. Therefore, the light-extraction efficiency E can be adjusted by adjusting the film thickness. The character $\lambda$ represents the wavelength of the light emitted from the emitting layer 33. In the case of full-color display using R, G, and B elements, the character $\lambda$ represents the wavelength of each color light.

As well as the above-described interference, constructive interferences include multiple interference that occurs due to reflections between the cathode 31 and the anode 35 as shown in FIG. 3B. In this case, a semitransparent reflecting electrode is used as the electrode on the light-extraction side. The electrode on the light-extraction side reflects part of the emitted light. The light emitted from the emitting layer 33 is repeatedly subjected to reflection between the cathode 31 and the anode 35 and strengthened by interference with each reflection. When this type of interference is used, the electrode on the light-extraction side is preferably formed of an ultra-thin metal film whose film thickness is 1 to 10 nm.

When such multiple interference is used, constructive interference depends on the optical distance D between the semitransparent reflecting electrode and the reflecting electrode, that is to say, in the case of this embodiment, between the cathode 31 and the anode 35. In general, when the optical distance D is an odd number multiple of $\lambda/4$, constructive interference occurs. In general, the optical distance D is expressed by the product of refractive index and film thickness. Therefore, the light-extraction efficiency E can be adjusted by adjusting the film thickness.

In this embodiment, the above-described interference depending on the optical distance d between the emitting position and the reflecting position, or the above-described multiple interference depending on the optical distance D between the semitransparent reflecting electrode and the reflecting electrode, or both, may be used.

In the present invention, the organic compound layer in a first pixel area where the drive voltage drop is larger has a film thickness such that the light-extraction efficiency is increased by optical interference. That is to say, the organic compound layer in the first pixel area, where the drive voltage drop is larger, has a film thickness such that constructive interference occurs. Specifically, as described above, the organic compound layer preferably has a film thickness such that the optical distance d is an odd number multiple of $\lambda/4$ or the optical distance D is an odd number multiple of $\lambda/4$. The optical distance d or D need not necessarily be an odd number multiple of $\lambda/4$, but is preferably close thereto.

In addition, in the present invention, the organic compound layer in a second pixel area where the drive voltage drop is smaller has a film thickness such that the light-extraction efficiency in the second pixel area is lower than that in the first pixel area. In addition, the organic compound layer in the second pixel area where the drive voltage drop is smaller preferably has a film thickness such that the product of the value of the current driving the organic EL element and the light-extraction efficiency in the first pixel area where the drive voltage drop is larger is equal to that in the second pixel area where the drive voltage drop is smaller. If such conditions are satisfied, an even luminance throughout the emitting area can be obtained.

In the present invention, when the current distribution is as shown in FIG. 4A, the distribution of light-extraction efficiency is preferably as shown in FIG. 4B. That is to say, the light-extraction efficiency E is preferably highest at the position p where the current I is smallest. The light-extraction efficiency E at the position q in the outer part of the display area is preferably lower than that at the position p. The reason is that when the value of the product of the drive current I and the light-extraction efficiency E is equal in each organic EL element, the luminance distribution can be even as shown in FIG. 4C. In order to obtain the distribution of light-extraction efficiency shown in FIG. 4B, the organic compound layer at the position p' where the light-extraction efficiency is highest has a film thickness such that the optical distance d is an odd number multiple of $\lambda/4$. In addition, the film thickness of the organic compound layer at the outer position q' where the light-extraction efficiency is low is smaller than that at the position p'.

In the present invention, the position p where the drive current I is smallest ideally corresponds to the position p' where the light-extraction efficiency E is highest, but need not necessarily correspond thereto. If the distance therebetween is small, a sufficient effect can be obtained. Specifically, when the height (vertical size) and the width (horizontal size) of the display area are H and W, respectively, the distance between the position p where the drive current I is smallest and the position p' where the light-extraction efficiency E is highest is preferably within $\pm H/4$ in the vertical direction and within $\pm W/4$ in the horizontal direction.

Next, a method for manufacturing a display apparatus according to the present invention will be described. In the method for manufacturing a display apparatus according to the present invention, the film thickness of the organic compound layer in the first organic EL element is controlled to be different from the film thickness of the organic compound layer in the second organic EL element so as to compensate for the difference in the drive voltage between the organic EL elements caused by different resistances. Specifically, the organic compound layer in first organic EL elements is formed so as to have a film thickness such that the light-extraction efficiency is increased by optical interference, and the organic compound layer in second organic EL elements is formed so as to have a film thickness such that the light-extraction efficiency in the second organic EL elements is lower than that of the first organic EL elements. In the present invention, the organic compound layer can be formed by, for example, vacuum deposition. In the case of a plurality of organic compound layers, the layers are preferably formed in different deposition chambers. In the case of full-color display using a plurality of kinds of pixels corresponding to a plurality of colors, such as R, G, and B, patterning is preferably performed color-by-color, using masks.

In order to adjust the film thickness of the organic compound layer according to the position in the display area, for example, the distance between a deposition source and a deposition surface is adjusted. Since the vaporized deposition material diffuses isotropically from the deposition source, the part of the deposition surface close to the deposition source is coated with a thicker film, and the part of the deposition surface distant from the deposition source is coated with a thinner film.

Figure 5:
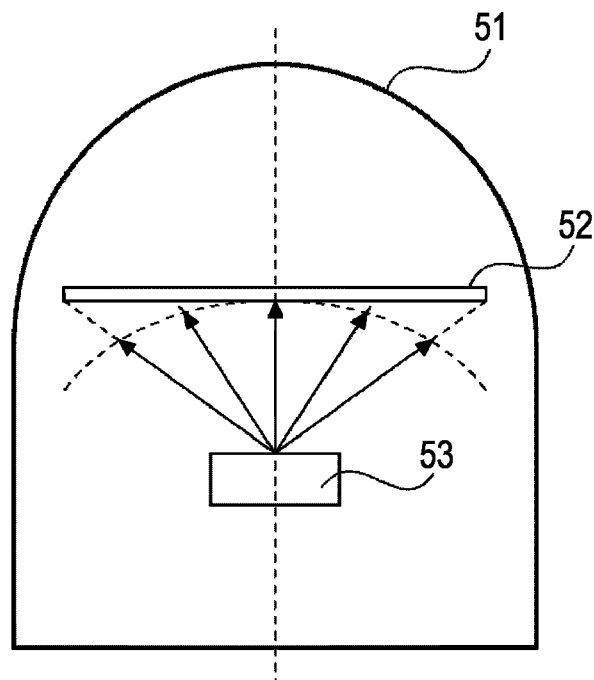
FIG. 5 is a schematic view showing an example of a deposition apparatus for adjusting film thickness of an organic compound layer.

FIG. 5 is a schematic view showing an example of a deposition apparatus. Reference numeral 51 denotes a deposition chamber, reference numeral 52 denotes a deposition substrate, and reference numeral 53 denotes a deposition source.

The vaporized deposition material diffuses isotropically from the deposition source 53 toward the deposition substrate 52. Therefore, the part of the deposition substrate 52 closest to the deposition source 53; that is to say just above the deposition source 53, is coated with a thicker film. In contrast, the peripheral part of the deposition substrate 52 more distant from the deposition source 53 is coated with a thinner film. By adjusting the distance between the deposition source 53 and the deposition substrate 52, the film thickness can be adjusted. The smaller the distance, the larger the difference in film thickness between the peripheral part and the part just above the deposition source. The larger the distance, the more even the film thickness.

By horizontally shifting the deposition source 53, the position where the film thickness is largest can be shifted.

Figure 7:
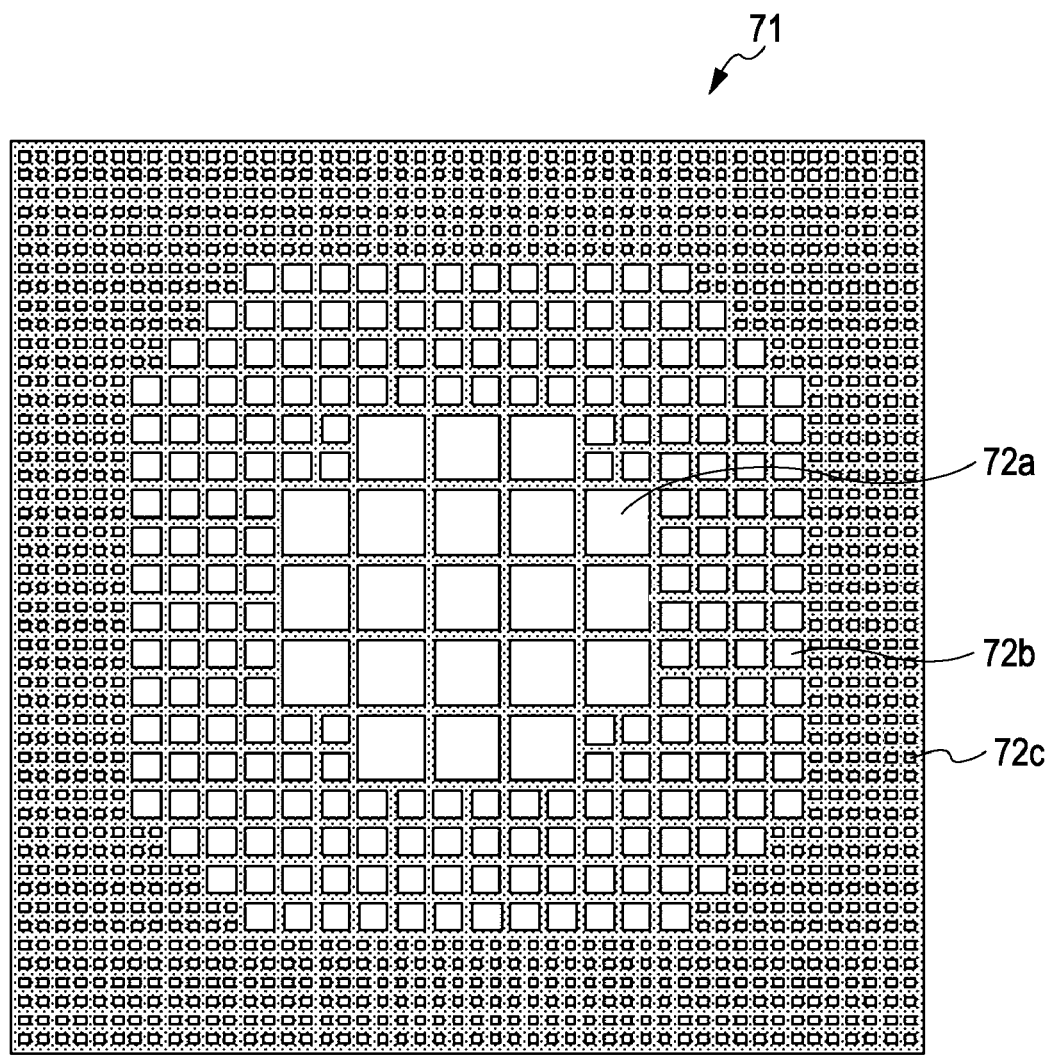
FIG. 7 is a schematic view showing an example of a mask used for manufacturing a display apparatus according to the present invention.

The film thickness of the organic compound layer can also be adjusted according to the position in the display area by a mask whose opening patterns differ between the central part and the peripheral part. FIG. 7 is a schematic view showing an example of a mask whose opening patterns differ between the central part and the peripheral part. In FIG. 7, reference numeral 71 denotes a mask, and reference numerals 72a, 72b, and 72c denote different sizes of openings. The openings 72b are smaller than the openings 72a, and the openings 72c are smaller than the openings 72b.

The largest openings 72a are disposed in the central part of the mask, and the smallest openings 72c are disposed in the peripheral part of the mask. That is to say, large openings are disposed in the part of the display area where the voltage drop is larger. The closer to the edge of the mask, the smaller the openings. Although the mask has three sizes of openings in FIG. 7, the mask may have more sizes of openings. The larger the number of sizes of openings, the smoother the film thickness distribution. When the mask 71 is used, a gap is provided between the mask 71 and the deposition substrate 52. The deposition material passes through the mesh pattern and forms a continuous film. The film thickness is large in the area where the openings of the mesh pattern are large, and decreases with the decrease of the size of the openings.

As described above, by using a mask having different opening patterns, the film thickness of the organic compound layer can be adjusted according to the position in the display area. By using a large mask having a plurality sets of such different opening patterns, a plurality of display apparatuses can be manufactured at the same time.

That is to say, the present invention provides a method for manufacturing a display apparatus including the step of forming a plurality of organic EL elements on a plurality of display apparatus areas on a substrate, and the step of separating the substrate after the step of forming a plurality of organic EL element, so as to obtain a plurality of display apparatuses.

The step of forming a plurality of organic EL elements includes the substep of forming an organic compound layer by deposition using a mask having a plurality of sets of different opening patterns such that the openings in the central part are larger than those in the peripheral part.

In this manufacturing method, a mask covering a plurality of display apparatus areas is disposed in the surface of a large substrate and then an organic compound layer is formed. Therefore, film formation for a plurality of display apparatus areas can be performed at the same time. After the formation of an organic compound layer, the large substrate is separated. In this way, a plurality of display apparatuses can be more easily manufactured.

In this embodiment, the method for forming an organic compound layer is not limited to the above method and other methods can be adopted. For example, the patterning of the peripheral part can be performed separately from the patterning of the central part.

The display apparatus according to the present invention can be suitably applied to the display portions of various electronic devices, for example, the electronic finder of a digital camera, the display portion of a TV set, and the display portion of a mobile phone.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-350779 filed Dec. 5, 2005 and No. 2006-290087 filed Oct. 25, 2006, which are hereby incorporated by reference herein in their entirety.

What is claimed is:

1. A top emission-type organic electroluminescence (EL) display apparatus comprising:
   a display portion comprising a plurality of organic EL elements, each organic EL element including a plurality of thin film transistors which control driving the organic EL element, a lower electrode disposed in each organic EL element, an upper electrode which is a light-transmissive common electrode shared by the plurality of the organic EL elements and extends outside the display portion, and an organic compound layer disposed between the lower electrode and the upper electrode; and
   an auxiliary interconnect disposed at the peripheral area of the display portion and connected to the upper electrode; and
   a circuit that supplies a voltage for driving the plurality of organic EL elements to the upper electrode via the auxiliary interconnect,
   wherein the thickness of the organic compound layer of each organic EL element is determined so that the product of the light-extraction efficiency, determined by optical interference, and the driving current of the each organic EL element, is uniform.

2. The display apparatus according to claim 1, wherein the lower electrode is a reflector, and the thickness of the organic compound layer is the thickness between an emitting position in the organic compound layer and a reflecting position on the reflector.

3. The display apparatus according to claim 1, wherein the upper electrode is a cathode, and the lower electrode is an anode.

4. A method for manufacturing a top emission-type organic electroluminescence (EL) display apparatus including,
   a display portion comprising a plurality of organic EL elements, each organic EL element including a plurality of thin film transistors which control driving the organic EL element, a lower electrode disposed in each organic EL element, an upper electrode which is a light-transmissive common electrode shared by the plurality of the organic EL elements and extends outside the display portion, and an organic compound layer disposed between the lower electrode and the upper electrode; and an auxiliary interconnect disposed at the peripheral area of the display portion and connected to the upper electrode: and a circuit that supplies a voltage for driving the plurality of organic EL elements to the upper electrode via the auxiliary interconnect, the method comprising: controlling film thickness of the organic compound layer of each organic EL element so that the product of the light-extraction efficiency, determined by optical interference, and the driving current of the each organic EL element, is uniform.

5. A method for manufacturing a top emission-type organic electroluminescence (EL) display apparatus including, a display portion comprising a plurality of organic EL elements, each organic EL element including a plurality of thin film transistors which control driving the organic EL element, a lower electrode disposed in each organic EL element, an upper electrode which is a light-transmissive common electrode shared by the plurality of the organic EL elements and extends outside the display portion, and an organic compound layer disposed between the lower electrode and the upper electrode; and an auxiliary interconnect disposed at the peripheral area of the display portion and connected to the upper electrode; and a circuit that supplies a voltage for driving the plurality of organic EL elements to the upper electrode via the auxiliary interconnect, the method comprising the steps of:

forming a plurality of organic EL elements in each of a plurality of display apparatus areas on a substrate; and separating the substrate after the step of forming a plurality of organic EL elements, so as to obtain a plurality of display apparatuses, wherein the step of forming a plurality of organic EL elements comprises the substep of forming an organic compound layer by deposition using a mask having a plurality of sets of different opening patterns such that the openings in the central part are larger than the openings in the peripheral part.

* * * * *